(12) United States Patent
Behrends et al.

(10) Patent No.: US 8,675,427 B2
(45) Date of Patent: Mar. 18, 2014

(54) IMPLEMENTING RC AND COUPLING DELAY CORRECTION FOR SRAM

(75) Inventors: Derick G. Behrends, Rochester, MN (US); Todd A. Christensen, Rochester, MN (US); Travis R. Hebig, Rochester, MN (US); Michael Launsbach, Rochester, MN (US); Daniel M. Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 13/414,133

(22) Filed: Mar. 7, 2012

(65) Prior Publication Data

US 2013/0235681 A1 Sep. 12, 2013

(51) Int. Cl.
*G11C 7/00* (2006.01)
(52) U.S. Cl.
USPC ................. 365/194; 365/203; 365/230.06
(58) Field of Classification Search
USPC ................. 365/194, 203, 230.06
See application file for complete search history.

(56) References Cited

U.S. PATENT DOCUMENTS

| 5,402,379 | A | 3/1995 | McClure |
| 6,034,913 | A | 3/2000 | Freimuth |
| 7,218,562 | B2 * | 5/2007 | Campbell ................ 365/203 |
| 7,843,750 | B2 | 11/2010 | Park et al. |
| 2002/0176273 | A1 | 11/2002 | Kang et al. |
| 2006/0274587 | A1 | 12/2006 | Houston |
| 2009/0316498 | A1 | 12/2009 | Chen et al. |
| 2010/0246241 | A1 | 9/2010 | Seko et al. |
| 2011/0026288 | A1 | 2/2011 | Watanabe |
| 2011/0032751 | A1 | 2/2011 | Funane et al. |

* cited by examiner

*Primary Examiner* — Son Dinh
*Assistant Examiner* — Nam Nguyen
(74) *Attorney, Agent, or Firm* — Joan Pennington (57) ABSTRACT

A method and circuit for implementing delay correction in static random access memory (SRAM), and a design structure on which the subject circuit resides are provided. The SRAM circuit includes a precharge enable signal coupled between precharge near and precharge far signals and wordline near and wordline far signals of the SRAM. A precharge pull down device is coupled between the precharge far signal and ground and is controlled responsive to the precharge enable signal to decrease a time delay of the falling transition of the precharge far signal. A respective word line pull up device is coupled between a respective wordline far signal and a voltage supply rail and is controlled responsive to the precharge enable signal to increase wordline voltage level upon a rising transition of the wordline far signal.

20 Claims, 6 Drawing Sheets

IMPLEMENTING RC AND COUPLING DELAY CORRECTION FOR SRAM

FIELD OF THE INVENTION

The present invention relates generally to the data processing field, and more particularly, relates to a method and circuit for implementing resistor capacitor (RC) and coupling delay correction on precharge and wordline signals for static random access memory (SRAM), and a design structure on which the subject circuit resides.

DESCRIPTION OF THE RELATED ART

As technology nodes advance, resistance of wires increases. This becomes problematic in SRAM memories with long wordlines. It is especially problematic when mapping an existing memory to a new technology node. The capacity of the memory may no longer be viable with the existing architecture.

For designs with many loads on a long wire, coupling capacitance can become a large factor in performance for the falling transition of the local precharge signal and the rising transition of the wordline.

A need exists for an efficient and effective mechanism to correct for increased RC and coupling delays seen in aggressively scaled SRAM memories.

SUMMARY OF THE INVENTION

Principal aspects of the present invention are to provide a method and circuit for implementing resistor capacitor (RC) and coupling delay correction in static random access memory (SRAM), and a design structure on which the subject circuit resides. Other important aspects of the present invention are to provide such method, circuit and design structure substantially without negative effects and that overcome many of the disadvantages of prior art arrangements.

In brief, a method and circuit for implementing delay correction in static random access memory (SRAM), and a design structure on which the subject circuit resides are provided. The SRAM circuit includes a precharge enable signal coupled between precharge near and precharge far signals and wordline near and wordline far signals of the SRAM. A precharge pull down device is coupled between the precharge far signal and ground and is controlled responsive to the precharge enable signal to decrease a time delay of the falling transition of the precharge far signal. A respective word line pull up device is coupled between a respective wordline far signal and a voltage supply rail and is controlled responsive to the precharge enable signal to increase wordline voltage level upon a rising transition of the wordline far signal.

In accordance with features of the invention, wordline and precharge delay resistor capacitor (RC) and coupling delay correction are provided without requiring any special timing functions.

In accordance with features of the invention, the precharge enable signal is logically equivalent to the precharge near signal and the precharge far signal. The precharge pull down device is implemented with an N-channel field effect transistor (NFET). The precharge enable signal is inverted and applied to a gate input of the precharge pull down NFET. The respective wordline pull up device is implemented with a P-channel field effect transistor (PFET). The respective wordline pull-up PFET is driven by a respective NAND gate having an input coupled to a respective wordline far signal and the precharge far signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits for implementing delay correction in static random access memory (SRAM), and a design structure on which the subject circuit resides are provided.

The present invention provides improvements to both the wordline signal and the precharge signal. The novel circuit of the invention does not require additional functions or circuits to provide special timing for the enabling and disabling of assist functions. The novel circuit of the invention corrects for large RC and coupling delays seen on the wordline and local precharge signals in prior art SRAM memories.

Figure 1:
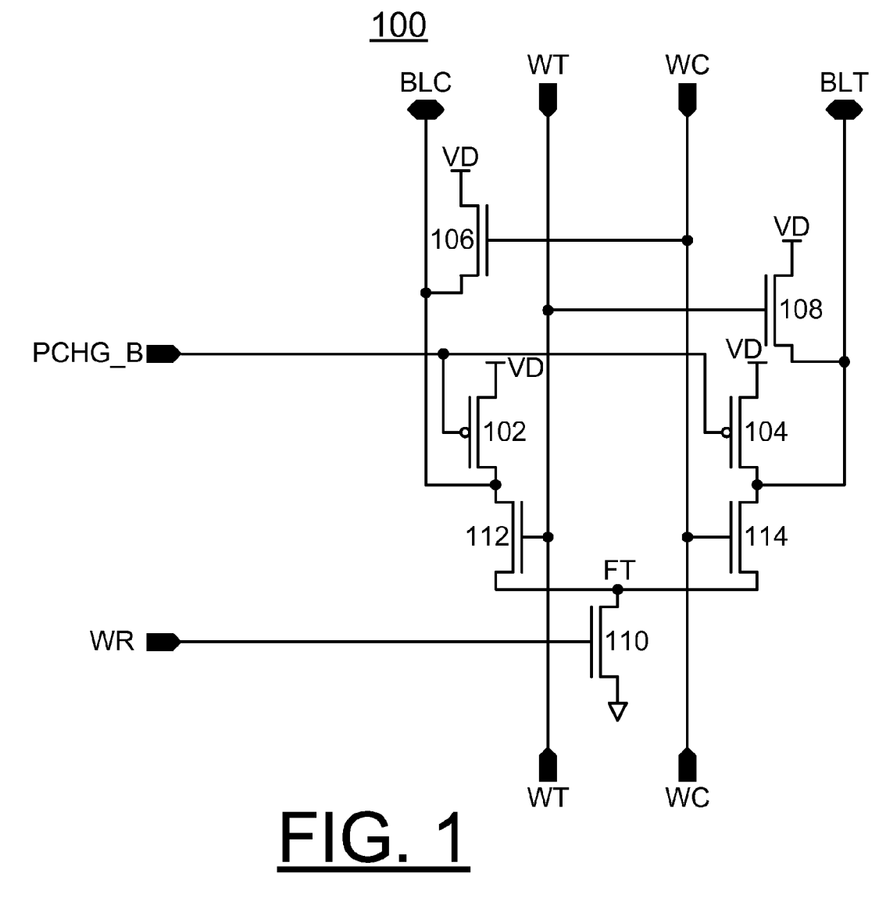
FIGS. 1 and 2 respectively provide a schematic diagram representation illustrating an example SRAM precharge circuit and an example SRAM cell in accordance with a preferred embodiment.
Figure 2:
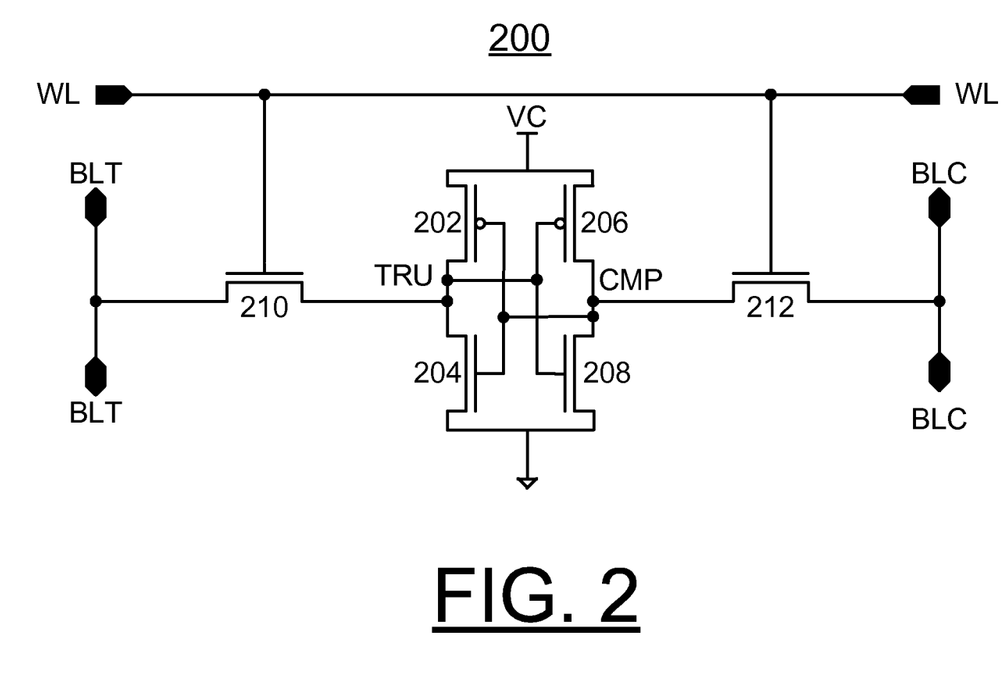

Having reference now to the drawings, in FIGS. 1, and 2, there are shown respective example SRAM local evaluation circuit or SRAM precharge circuit and an example SRAM cell respectively generally designated by the reference characters 100, and 200 in accordance with a preferred embodiment.

SRAM precharge and write circuit 100 includes a pair of precharge P-channel field effect transistors (PFETs) 102, 104 respectively coupled between a voltage supply rail VD and respective true and complement bit lines BLT, BLC. The precharge signal PCHG_B is applied to a gate of each precharge PFETs 102, 104 for precharging the respective true and complement bit lines BLT, BLC.

SRAM precharge and write circuit 100 includes an NFET 110 receiving a gate input of the write signal WR and respectively connected between a ground potential rail and a second pair of N-channel field effect transistors (NFETs) 112, 114. The respective write data signals WC, WT are respectively applied to a gate of the respective NFETs 112, 114. The NFETs 112, 114 are connected between the NFET 110 and the PFETs 102, 104 at connection to the respective true and complement bit lines BLT, BLC.

SRAM precharge and write circuit 100 includes a first pair of N-channel field effect transistors (NFETs) 106, 108 used for driving the true and complement bit lines BLT, BLC during the write operation. Write data signals WT, WC are used to drive the respective BLT, BLC nodes to the appropriate value when writing to a respective SRAM cell. The respective write data signals WC, WT are respectively applied to a gate of the NFETs 106, 108. NFETs 106, 108 are coupled between the voltage supply rail VD and the respective true and complement bit lines BLT, BLC.

In SRAM precharge and write circuit 100, a local precharge PFET gate to drain coupling capacitance or Miller capacitance exists with respect to the respective true or complement bit lines BLT, BLC of PFETs 102, 104 (between the precharge signal PCHG_B line and the bit line BLT for PFET 102, or bit line BLC for PFET 104). When the local precharge signal falls either bit line BLT, or bit line BLC will rise, depending on which one discharged during the previous evaluate cycle causing the local precharge falling edge to be severely degraded due to coupling capacitance across PFET 102, or PFET 104.

Referring to FIG. 2, as shown SRAM cell 200 includes a six-transistor SRAM cell. SRAM cell 200 includes four transistors 202, 204, 206, and 208 configured as a cross-coupled latch for storing data. A pair of transistors 210, 212 is used to obtain access to the memory cell. A wordline input WL provides a gate input to the N-channel field effect transistor (NFETs) 210, 212. The wordline input WL is activated, turning on respective NFETs 210, 212 to perform a read or write operation.

In SRAM cell 200, a wordline NFET gate to drain coupling or Miller capacitance exists with respect to the respective true or complement bit lines BLT, BLC of NFETs 210, 212 (between the wordline WL and the bit line BLT for NFET 210, or bit line BLC for NFET 212). When the wordline WL rises either bit line BLT, or bit line BLC will fall, causing the rising edge of the wordline WL to be severely degraded due to gate to drain coupling capacitance across NFET 210, or NFET 212.

Figure 3:
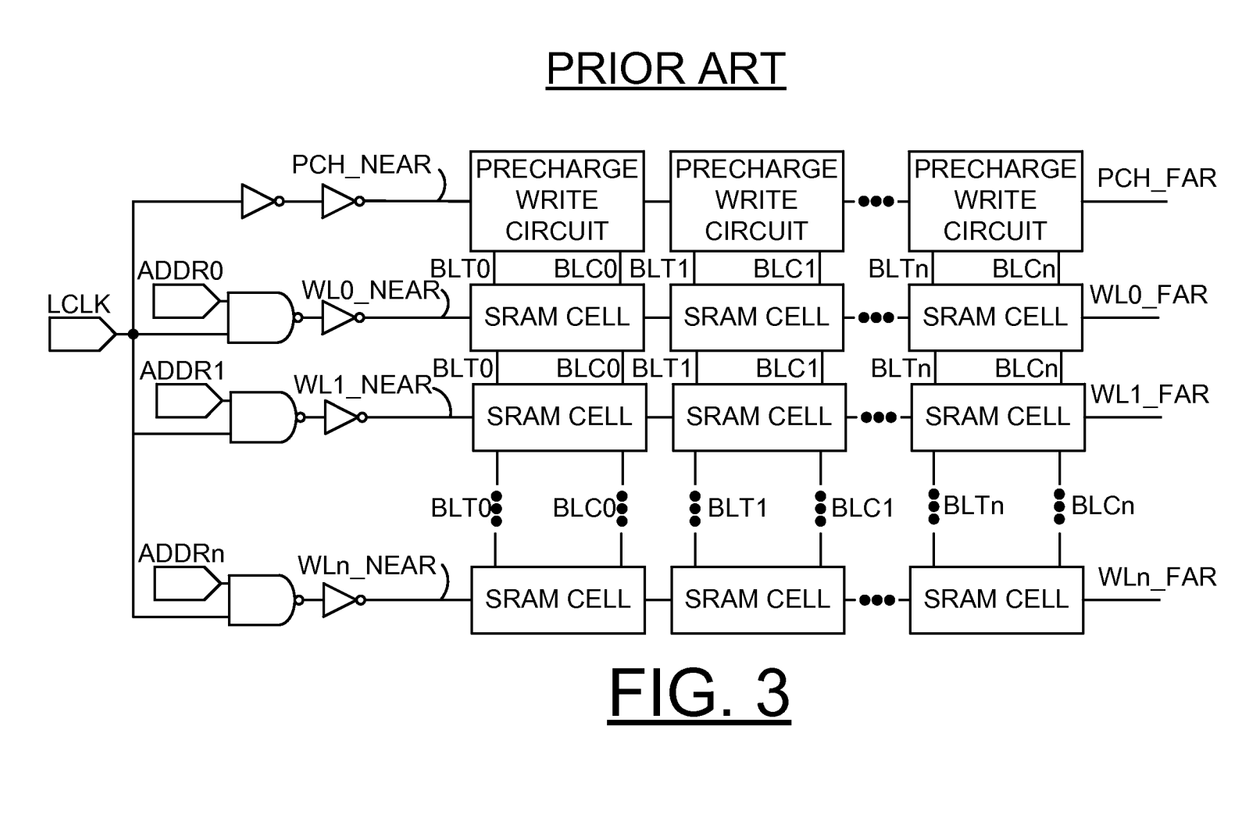
FIGS. 3 and 4 respectively provide a respective schematic and block diagram representation illustrating a conventional SRAM circuit with a prior art wordline and precharge configuration and an example SRAM circuit for implementing wordline and precharge delay correction in accordance with a preferred embodiment.

FIG. 3 illustrates such conventional SRAM circuit with a prior art wordline and precharge configuration where in aggressively scaled SRAM memories the falling transition of the local precharge signal and the rising transition of the wordline become problematic and correction of resistor capacitor (RC) and coupling delay is needed. The SRAM circuit includes an array of SRAM cells and respective precharge and write circuits. The precharge signal PCH to the precharge circuits and the wordlines WLs are driven from one side to the other side of the array, or from PCH_NEAR to PCH_FAR and WL0-WLn_ NEAR to WL0-WLn_FAR.

Figure 4:
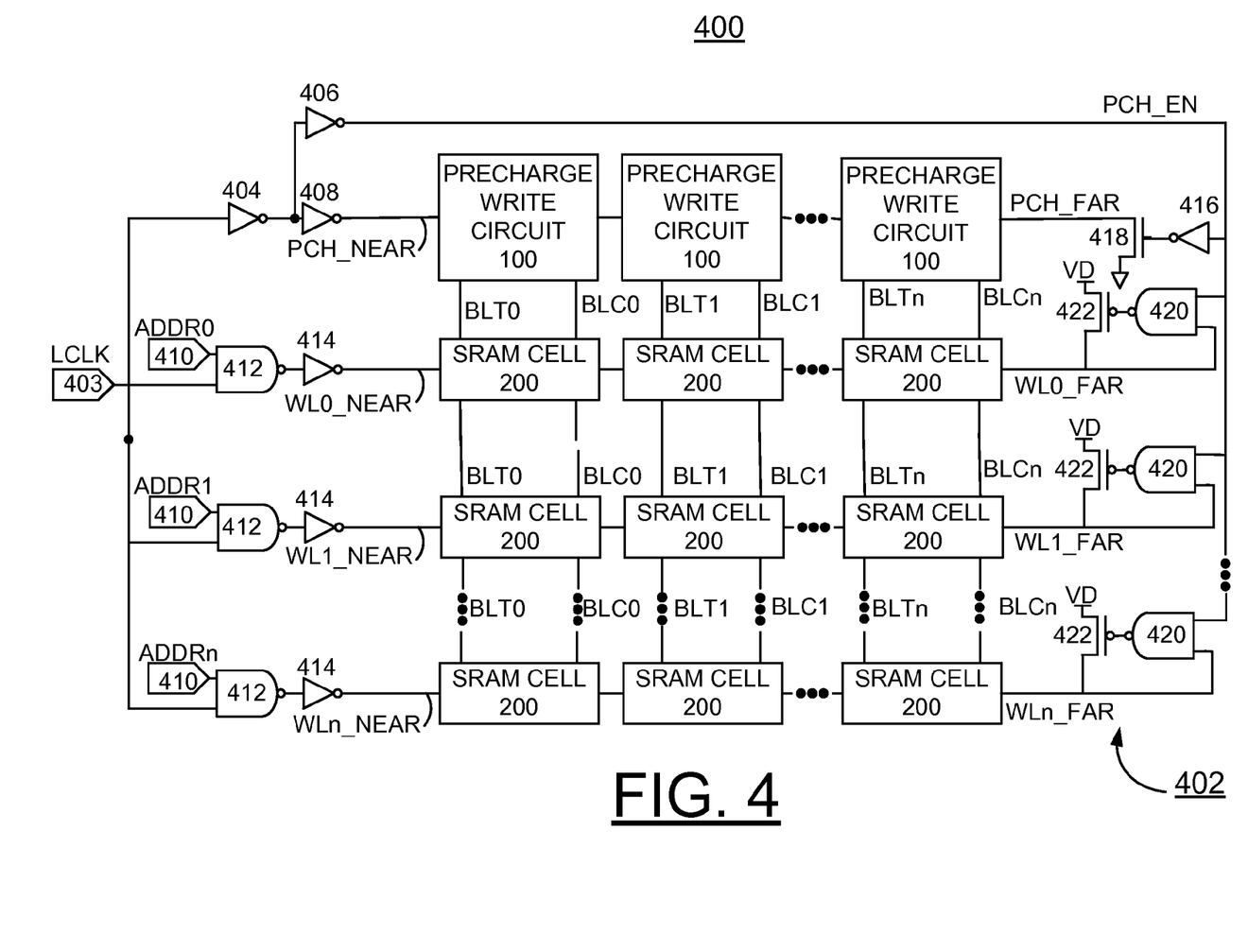

In accordance with features of the invention, as illustrated and described with respect to FIG. 4, SRAM circuit 400 includes wordline and precharge delay correction or delay improvement circuitry including a precharge enable signal. A precharge pull down device is coupled between a precharge far signal and ground and is controlled responsive to the precharge enable signal to decrease a time delay of the falling transition of the precharge far signal. A respective word line pull up device is coupled between a respective wordline far signal and a voltage supply rail and is controlled responsive to the precharge enable signal to increase a rising transition of the respective wordline far signal.

Referring to FIG. 4, there is shown an example SRAM circuit for implementing wordline and precharge delay correction generally designated by the reference character 400 in accordance with a preferred embodiment. SRAM circuit 400 includes wordline and precharge delay improvement circuitry generally designated by the reference character 402 added to the far end of the local precharge signal or wire PCH_FAR and added to the far end of the wordline signals or wires WL0_FAR-WLn_FAR to improve the speed of the falling transition of the local precharge signal and the rising transition of the wordlines.

At a proximal or near end of the SRAM circuit 400, a source of the precharge signal PCH_NEAR and respective wordline signals WL0_NEAR-WLn_NEAR includes a local clock input 403 LCLK applied to a first inverter 404 coupled to a second inverter 406 providing a precharge enable signal PCH_EN, which is logically equivalent to a precharge signal PCH_NEAR and PCH_FAR. The precharge enable signal PCH_EN is applied to the wordline and precharge delay improvement circuitry 402. The precharge enable signal PCH_EN is not connected to the load of all the devices in the local precharge circuits 100, which means that the precharge enable signal PCH_EN sees less RC delay than the prior art PCH_FAR in the conventional SRAM circuit of FIG. 3. Also since the precharge enable signal PCH_EN is not connected to the load of all the devices in the respective SRAM cells, which means that the precharge enable signal PCH_EN sees less RC delay than the prior art respective wordline signals WL0_FAR-WLn_FAR in the conventional SRAM circuit of FIG. 3 and respective wordline signals WL0_FAR-WLn_FAR at the distal or far end of SRAM circuit 400.

SRAM circuit 400 includes an inverter 408 coupled to the first inverter 404 providing the precharge signal PCH_NEAR to a first precharge and write circuit 100. SRAM circuit 400 includes a plurality of address inputs 410, ADDR0-ADDRn applied to a first input of a respective NAND gate 412 with the local clock input 403 LCLK applied to a second input of the respective NAND gate 412. A respective inverter 414 coupled to the output of the respective NAND gates 412 applies a respective wordline input WL0_NEAR-WLn_NEAR to a first SRAM cell 200 on a first side of the SRAM circuit 400. SRAM circuit 400 includes a plurality of precharge circuits 100 connected to respective SRAM cells 200 by respective true and complement bit lines BLT0, BLC0-BLTn, BLCn.

The wordline and precharge delay improvement circuitry 402 includes an inverter 416 receiving the precharge enable signal PCH_EN and applying a gate input to a pull down device 418 or NFET 418, which applies a precharge signal PCH_FAR to the last precharge and write circuit 100. The pull down NFET 418 pulls the precharge signal input PCH_FAR low with the precharge enable signal PCH_EN falling.

The wordline and precharge delay improvement circuitry 402 includes a respective NAND gate 420 receiving a respective first input of the precharge enable signal PCH_EN and a respective second input of the respective wordline WL0_FAR-WLn_FAR. The respective NAND gate 420 applies a gate input to a respective wordline pull-up PFET 422 connected between the voltage supply VD and the respective wordline WL0_FAR-WLn_FAR. The respective wordline pull-up PFET 422 is driven by the output of the respective NAND gate 420. The precharge enable signal PCH_EN rising causes a high or one at the input of all the NAND gates 420.

When one of the wordlines rises, the corresponding one of WL0_FAR-WLn_FAR of the wordlines will rise. When the switch point of the corresponding NAND gate 420 is reached, the output of the corresponding NAND gate 420 goes low and turns on the PFET 422 connected to that particular one of WL0_FAR-WLn_FAR of the wordlines. This PFET 422 pulls the wordline up the rest of the way to the power supply voltage level VD.

The inverter 416 and the respective NAND gates 420 of the wordline and precharge delay improvement circuitry 402 have predefined beta ratios to provide respective fast responses responsive to the precharge enable signal PCH_EN rising.

Figure 5:
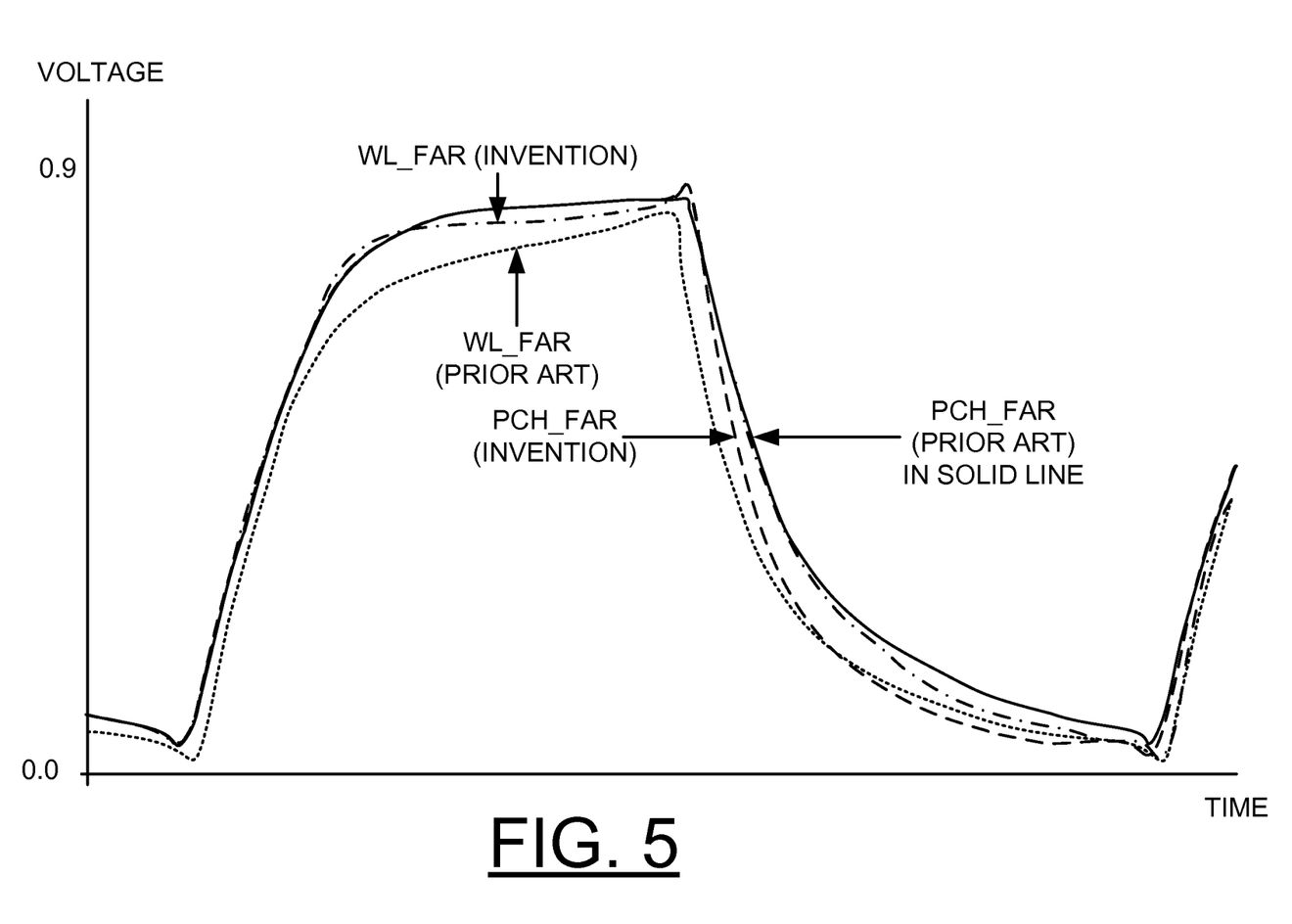
FIG. 5 are waveform diagrams illustrating example operations the SRAM circuit of FIG. 4 for implementing wordline and precharge delay correction in accordance with a preferred embodiment for comparison with example operations of the prior art SRAM circuit of FIG. 3.

Referring also to FIG. 5, the performance of the prior art circuit shown in FIG. 3 and the SRAM circuit 400 including the wordline and precharge delay improvement circuitry 402 of invention is shown. It can be seen from the waveforms shown in FIG. 5 that the prior art wordline signal WL_FAR does not reach the power supply voltage level VD. For example, at the mid point of the wordline pulse, the prior art WL_FAR only reaches 793 mV, which is 91% of the power supply voltage. This is due to the large RC delay present on the wordline wire and the coupling on the wordline of all the bitlines switching from a 1→0 during this read operation. However, at the mid point of the wordline pulse, the WL_FAR signal of the invention disclosed here reaches 845 mV, which is 97% of the power supply voltage.

It can also be seen from the waveforms shown in FIG. 5 that the RC delay of the precharge signal falling for the prior art circuit is, for example, 18 ps with PCH_FAR (PRIOR ART) indicated in solid line. This is measured as the delay between PCH_NEAR and PCH_FAR at the midpoint of their falling edges. However, in the SRAM circuit 400 including the wordline and precharge delay correction circuitry 402 of invention, this delay of the precharge signal falling is only 9 ps with PCH_FAR (INVENTION) indicated in dashed line. This is a 50% improvement over the prior art.

Figure 6:
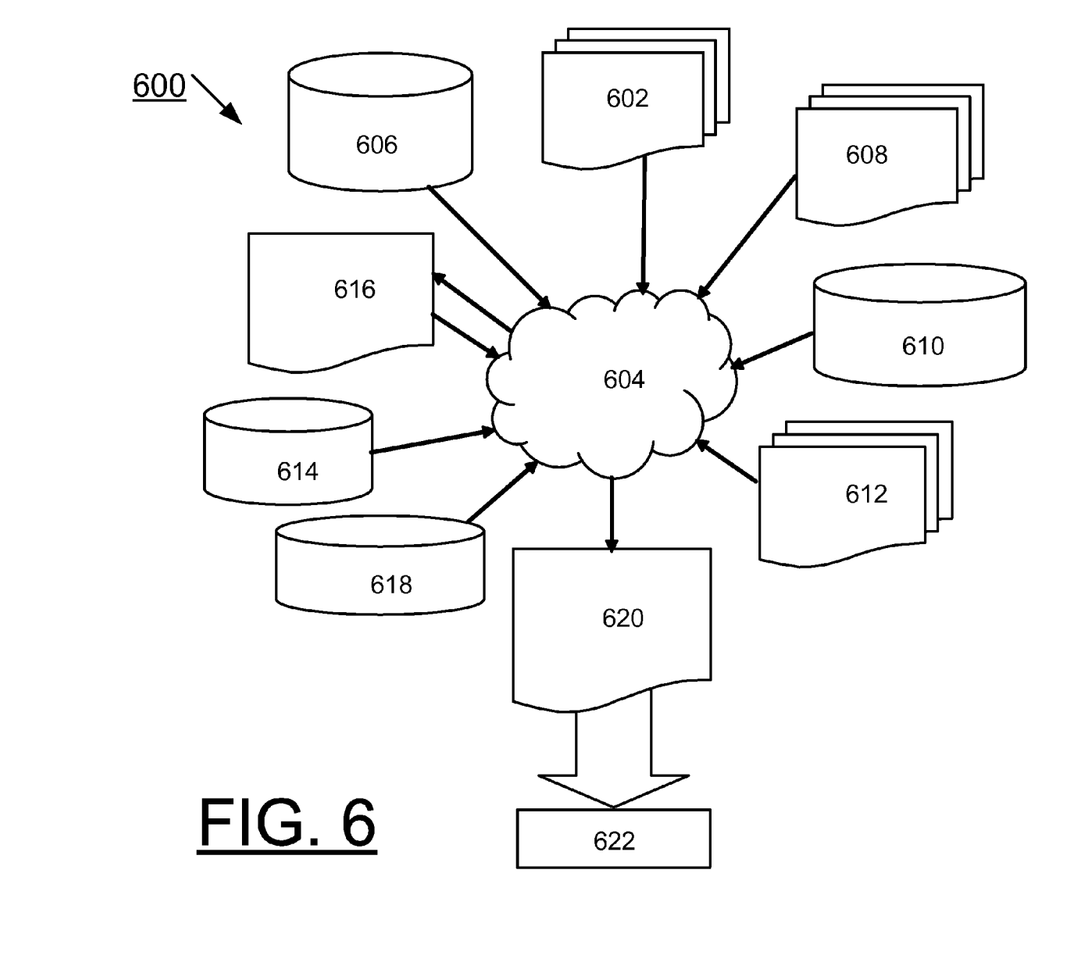
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuits 100, 200, and 400 in the form of schematics or HDL, a hardware-description language, for example, Verilog, VHDL, C, and the like. Design structure 602 may be contained on one or more machine readable medium. For example, design structure 602 may be a text file or a graphical representation of circuits 100, 200, and 400. Design process 604 preferably synthesizes, or translates, circuits 100, 200, and 400 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuit.

Design process 604 may include using a variety of inputs; for example, inputs from library elements 608 which may house a set of commonly used elements, circuits, and devices, including models, layouts, and symbolic representations, for a given manufacturing technology, such as different technology nodes, 22 nm, 32 nm, 45 nm, 90 nm, and the like, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 1, 2, and 4 along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, and 4. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing delay improvement in static random access memory (SRAM) including a precharge signal and respective wordline signals extending from a source near end to a distal far end of the SRAM, said circuit comprising:

a precharge enable signal; said precharge enable signal coupled between precharge near and precharge far signals and wordline near and wordline far signals at proximal and distal ends of the SRAM;

a precharge pull down device coupled between said precharge far signal and ground; said precharge pull down device being controlled responsive to said precharge enable signal to decrease a time delay of a falling transition of said precharge far signal; and a respective word line pull up device coupled between a respective wordline far signal and a voltage supply rail; said respective word line pull up device being controlled responsive to said precharge enable signal to increase wordline voltage level upon a rising transition of said respective wordline far signal.

2. The circuit as recited in claim 1 wherein said precharge enable signal is logically equivalent to said precharge near signal and said precharge far signal.

3. The circuit as recited in claim 1 wherein said precharge pull down device is implemented with an N-channel field effect transistor (NFET).

4. The circuit as recited in claim 3 wherein said precharge enable signal is inverted and applied to a gate input of said precharge pull down NFET.

5. The circuit as recited in claim 1 wherein said respective wordline pull up device is implemented with a P-channel field effect transistor (PFET).

6. The circuit as recited in claim 1 wherein said respective wordline pull-up PFET is driven by a respective NAND gate, each said respective NAND gate having an input coupled to said respective wordline far signal and said precharge enable signal.

7. A design structure embodied in a machine readable medium used in a design process, the design structure comprising:
a circuit tangibly embodied in the machine readable medium used in the design process, said circuit for implementing delay improvement in static random access memory (SRAM) including a precharge signal and respective wordline signals extending from a source near end to a distal far end of the SRAM, said circuit comprising:
a precharge enable signal; said precharge enable signal coupled between precharge near and precharge far signals and wordline near and wordline far signals at proximal and distal ends of the SRAM;
a precharge pull down device coupled between said precharge far signal and ground; said precharge pull down device being controlled responsive to said precharge enable signal to decrease a time delay of a falling transition of said precharge far signal; and
a respective word line pull up device coupled between a respective wordline far signal and a voltage supply rail; said respective word line pull up device being controlled responsive to the precharge enable signal to increase wordline voltage level upon a rising transition of said respective wordline far signal, wherein the design structure, when read and used in the manufacture of a semiconductor chip produces a chip comprising said circuit.

8. The design structure of claim 7, wherein the design structure comprises a netlist, which describes said circuit.

9. The design structure of claim 7, wherein the design structure resides on storage medium as a data format used for the exchange of layout data of integrated circuits.

10. The design structure of claim 7, wherein the design structure includes at least one of test data files, characterization data, verification data, or design specifications.

11. The design structure of claim 7, wherein said precharge pull down device is implemented with an N-channel field effect transistor (NFET).

12. The design structure of claim 7, wherein said precharge enable signal is inverted and applied to a gate input of the precharge pull down NFET.

13. The design structure of claim 7, wherein said respective wordline pull up device is implemented with a P-channel field effect transistor (PFET).

14. The design structure of claim 13, wherein said respective wordline pull up PFET is driven by a respective NAND gate, each said respective NAND gate having an input coupled to said respective wordline far signal and the precharge far signal.

15. A method for implementing delay improvement in static random access memory (SRAM) including a precharge signal and respective wordline signals extending from a source near end to a distal far end of the SRAM, said method comprising:
providing a precharge enable signal; coupling said precharge enable signal between precharge near and precharge far signals and wordline near and wordline far signals at proximal and distal ends of the SRAM;
providing a precharge pull down device coupled between the precharge far signal and ground; and controlling said precharge pull down device responsive to said precharge enable signal to decrease a time delay of a falling transition of said precharge far signal; and
providing a respective word line pull up device coupled between a respective wordline far signal and a voltage supply rail; and controlling said respective word line pull up device responsive to said precharge enable signal to increase wordline voltage level upon a rising transition of said respective wordline far signal.

16. The method as recited in claim 15 wherein providing said precharge pull down device coupled between the precharge far signal and ground includes providing an N-channel field effect transistor (NFET) coupled between said precharge far signal and ground.

17. The method as recited in claim 16 wherein controlling said precharge pull down device responsive to the precharge enable signal to decrease a time delay of a falling transition of said precharge far signal include inverting said precharge enable signal and applying the inverted precharge enable signal to a gate input of said precharge pull down NFET.

18. The method as recited in claim 15 wherein providing said respective word line pull up device coupled between said respective wordline far signal and said voltage supply rail includes providing a respective word line pull up P-channel field effect transistor (PFET) coupled between said respective wordline far signal and said voltage supply rail.

19. The method as recited in claim 18 includes providing a respective NAND gate for driving said respective wordline pull up PFET, each said respective NAND gate having an input coupled to said respective wordline far signal and said precharge far signal.

20. The method as recited in claim 15 wherein coupling said precharge enable signal between precharge near and precharge far signals and wordline near and wordline far signals of the SRAM includes directly connecting said precharge enable signal between a precharge near circuit and a precharge far circuit.

\* \* \* \* \*